(12) United States Patent
Sweegers et al.

(10) Patent No.: US 10,290,675 B2
(45) Date of Patent: May 14, 2019

(54) LIGHT EMITTING DIODE MODULE AND METHOD OF FORMING A LIGHT EMITTING DIODE MODULE

(71) Applicant: Lumileds Holding B.V., Schiphol (NL)

(72) Inventors: Norbertus Antonius Maria Sweegers, Aachen (DE); Marc André De Samber, Aachen (DE)

(73) Assignee: Lumileds Holding B.V., Schiphol (NL)

( * ) Notice: Subject to any disclaimer, the term of this patent is extended or adjusted under 35 U.S.C. 154(b) by 0 days.

(21) Appl. No.: 15/738,093

(22) PCT Filed: Jun. 16, 2016

(86) PCT No.: PCT/EP2016/063864
§ 371 (c)(1),
(2) Date: Dec. 19, 2017

(87) PCT Pub. No.: WO2016/207053
PCT Pub. Date: Dec. 29, 2016

(65) Prior Publication Data
US 2018/0197912 A1 Jul. 12, 2018

(30) Foreign Application Priority Data
Jun. 25, 2015 (EP) ..................................... 15173760

(51) Int. Cl.
*H01L 33/00* (2010.01)
*H01L 27/15* (2006.01)
(Continued)

(52) U.S. Cl.
CPC ............. *H01L 27/153* (2013.01); *F21K 9/60* (2016.08); *H01L 25/0753* (2013.01);
(Continued)

(58) Field of Classification Search
CPC ..... H01L 27/153; H01L 33/005; H01L 33/52; H01L 33/58; H01L 33/60
See application file for complete search history.

(56) References Cited

U.S. PATENT DOCUMENTS

2011/0260179 A1* 10/2011 Hung ...................... H01L 33/54
257/88

FOREIGN PATENT DOCUMENTS

| WO | 2015007755 A2 | 1/2015 | |
|---|---|---|---|
| WO | 2015028334 A1 | 3/2015 | |
| WO | WO-2015028334 * | 3/2015 | ............. F21K 99/00 |

OTHER PUBLICATIONS

EPO as ISA, "International Search Report and Written Opinion" dated Sep. 1, 2016 from International Application No. PCT/EP2016/063864, filed Jun. 16, 2016, 13 pages.
(Continued)

*Primary Examiner* — Joseph M Galvin, III
(74) *Attorney, Agent, or Firm* — Patent Law Group LLP; Brian D. Ogonowsky

(57) ABSTRACT

The invention provides an LED module having a concentrated light output window. Light output from a first output window of an LED assembly (e.g. from a plurality of LEDs) is passed to an input window of a light directing element and redirected to be emitted from a second, smaller output window of a light directing element. This difference in size thereby concentrates the light output by the light directing element. The second output window (of the light directing element) is substantially perpendicular to the first output window, allowing for the size of the LED assembly in a particular dimension to not be necessarily constrained by the size of the second output window.

9 Claims, 7 Drawing Sheets

(51) Int. Cl.
  *H01L 33/60* (2010.01)
  *F21K 9/60* (2016.01)
  *H01L 25/075* (2006.01)
  *H01L 33/52* (2010.01)
  *F21V 8/00* (2006.01)
  *F21Y 115/10* (2016.01)
  *H01L 33/58* (2010.01)
(52) U.S. Cl.
  CPC ............ *H01L 33/005* (2013.01); *H01L 33/52* (2013.01); *H01L 33/60* (2013.01); *F21Y 2115/10* (2016.08); *G02B 6/0073* (2013.01); *H01L 33/58* (2013.01); *H01L 2933/0033* (2013.01)

(56) References Cited

OTHER PUBLICATIONS

Extended European Search Report dated Dec. 8, 2015 from European Patent Application No. 15173760.8 filed Jun. 25, 2015, 7 pages.

\* cited by examiner

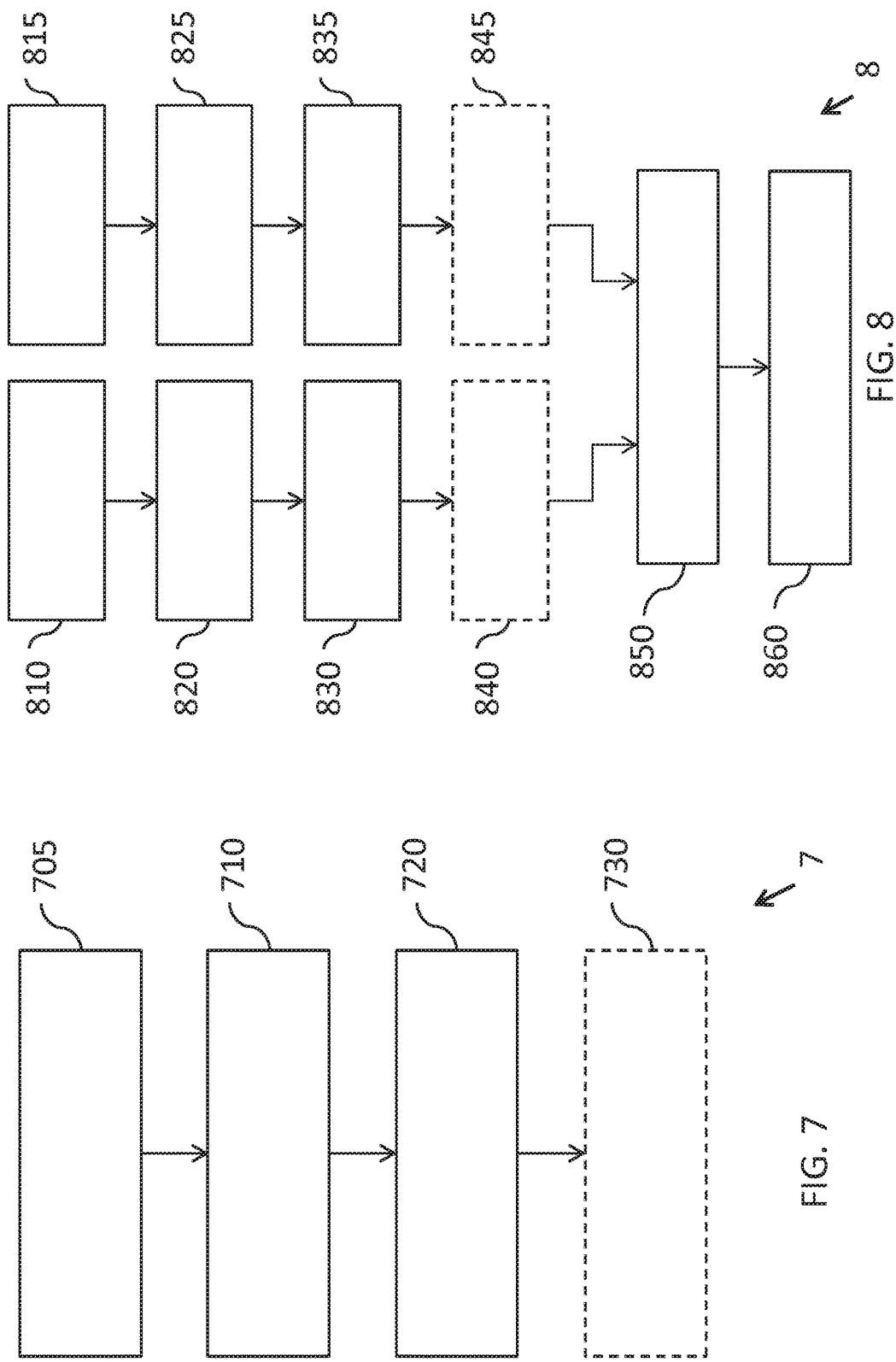

LIGHT EMITTING DIODE MODULE AND METHOD OF FORMING A LIGHT EMITTING DIODE MODULE

CROSS-REFERENCE TO RELATED APPLICATIONS

The present application is a § 371 application of International Application No. PCT/EP2016/063864 filed on Jun. 16, 2016 and titled "A LIGHT EMITTING DIODE MODULE AND METHOD OF FORMING A LIGHT EMITTING DIODE MODULE," which claims the benefit of European Patent Application No. 15173760.8 filed on Jun. 25, 2015. International Application No. PCT/EP2016/063864 and European Patent Application No. 15173760.8 are incorporated herein.

FIELD OF THE INVENTION

This invention relates to the field of LED modules, and in particular to LED modules having a light directing element.

BACKGROUND OF THE INVENTION

There has been an increasing trend in the use of LED modules in projection lighting systems, outdoor lighting systems and automotive lighting systems, for example, headlights. In these and other environments, there is a growing desire for high luminance light sources.

Known methods of optimizing the luminance of a light source include the use of a light conversion element, high power LEDs and more closely spaced LEDs. However, even through use of such methods, there is still a limitation on the maximum attainable brightness. Presently, for example, the approximate illuminance limit of such an LED light source is 250 lm/mm$^2$.

Furthermore, using high power LEDs and closely spaced LEDs increases the required heat dissipation for the LED module, this may place a further limit on the available size and/or efficiency of the LEDs.

SUMMARY OF THE INVENTION

The invention is defined by the claims.

According to a first aspect of the invention, there is provided an LED module comprising: an LED assembly comprising a plurality of LEDs, the LED assembly having a first output window from which light emitted by the said plurality of LEDs is output; and a light directing element comprising a first input window and a second output window, wherein the light directing element is adapted to receive light at the first input window and direct the received light to be output at the second output window, wherein: the light directing element is positioned to receive light output from the first output window at the first input window; the second output window has a smaller area than the first output window; and the second output window is in a plane substantially normal to a plane of the first output window.

In other words, according to an embodiment, a plurality of light emitting diodes or LEDs (forming an LED assembly) may be provided. There is defined a first output window of the LED assembly from which light emitted from the plurality of LEDs passes in at least a first direction. The light passing through this first output window is received by a light directing element at a first input window. The light directing element directs the light received at the first input window to a second output window of the light directing element, to thereby emit the light. Thus, light received by the light directing element is directed from an input window to a second output window.

The second output window has a smaller surface area than the first output window (of the LED assembly). In other words, the light output from the second output window is more concentrated (e.g. brighter) that the light emitted from the LED assembly through the first output window.

The second output window is positioned to be in a plane normal to the first output window. In other words, the second output window is substantially perpendicular to the first output window. There may be thought to be light emitted from the first output window in a first direction, which is directed by the light directing element to be output from the second output window in a second direction, wherein the second direction is substantially perpendicular to the first direction (e.g. 85°-95° from the first direction).

It will be readily understood that this permits the area of the LED assembly to be of a greater size than the window from which light is output from the LED module. Furthermore, positioning the LED module perpendicular to this final output window (i.e. second output window) allows for a 3-dimensional design approach, which may allow for improved heat spreading and heat sink means to be implemented.

Indeed, it is herein advantageously recognised that 3 dimensional capabilities allow for increased thermal management whilst achieving a small light exit window. This is at least partly due to the fact that an increased area is available for heat sinking means at the LED assembly, as the size of the LED assembly need not be constrained by the size of the LED module light exit window (i.e. the second output window).

In at least one embodiment, the light directing element is directly coupled to the LED assembly such that light output from the first output window of the LED assembly is directly coupled into the first input window of the light directing element.

In other words, the first output window and the first input window may be positioned together so as to be immediately facing and proximate to one another. This will advantageously improve the coupling of light from the first output window to the first input window to minimise the potential loss of light.

In some embodiments, the LED assembly is mounted on a flexible substrate.

In other or further embodiments, the light directing element is further adapted to, upon receiving light of a first wavelength at the first input window, emit further light having a different wavelength such that the light output at the second output window has a greater range of wavelengths than light received at the first input window.

In at least one such embodiment, the light directing element may be adapted to act as a conversion element, such that at least some of the light received by the light directing element may be converted into light of a different wavelength. This enables the light directing element to emit light of a greater range of wavelengths than that received by the light directing element.

This advantageously allows LEDs having a greater efficiency and/or brightness (e.g. blue LEDs) to be provided in the LED assembly. Converting some of this light into light of a different colour (e.g. changing some blue light into yellow light) may allow a greater and/or more desirable range of wavelengths of light to be emitted by the LED module.

WO 2015/028334 A1 discloses a light emitting device comprising a substrate, at least one LED and a light guide. The LED is at least partly embedded in the light guide.

US 2011/260179 A1 discloses a flexible LED packaging structure with one or more LEDs. An LED is bonded onto and connected with a first metal foil substrate and a second metal foil substrate. LEDs may be positioned in different planes.

The LED module may further comprise an encasing mould adapted to encase the LED assembly and the light directing element so as to reduce light leakage from the said LED assembly and light directing element, wherein the encasing mould is formed so as to not cover the second output window, thereby allowing light to be output from the LED module from the second output window.

In other words the LED assembly and the light directing element may be at least partially covered by an encasing mould so as to reduce light leakage or light escaping from the LED assembly and/or the light directing element. For example, a reflective element may be positioned to cover external surfaces of the LED assembly and/or light directing elements so as to reflect any escaping light back into the respective LED assembly or light directing element.

The encasing mould is adapted to not cover the second output window such that light may be output from the LED module. In embodiments, the encasing mould covers substantially all of the LED assembly and the light directing element such that the only area from which light may be output (e.g. into air) from the LED module is the second output window.

Advantageously, the light directing module is formed as a triangular prism, the second output window being a side edge of the triangular prism. In embodiments, the light directing module may be formed as a tapering prism (i.e. a triangular prism), wherein the base (i.e. least tapered side edge) of the tapering prism is the second output window. This advantageously optimizes the directionality of the light inside the light directing element to be biased toward the second output window.

In some embodiments, there may be provided an LED module further comprising an additional LED assembly comprising a plurality of LEDs, the additional LED assembly having a third output window from which light emitted by the said plurality of LEDs is output; and an additional light directing element comprising a second input window and a fourth output window, wherein the light directing element is adapted to receive light at the second input window and direct the received light to be output at the fourth output window, wherein the additional light directing element is positioned to receive light output from the third output window at the second input window and the fourth output window has a smaller area than the third output window, and the fourth output window is in a plane substantially normal to a plane of the third output window.

In other words, an LED module may comprise a first and a second LED assembly, each associated with a respective first and second light directing element.

In a further embodiment the LED assembly and the additional LED assembly are both mounted on a single substrate comprising flexible material; the light directing element is mounted on the LED assembly such that the first input window is directly coupled to the first output window; the additional light directing element is mounted on the additional LED assembly such that the second input window is directly coupled to the third output window; and the single substrate is adapted to be sufficiently bendable such that the light directing element and the additional light directing element are capable of being positioned back-to-back.

In other words, the first and second LED assembly may both be mounted on the same substrate, wherein the substrate comprises flexible material. The substrate is adapted to be bendable (e.g. the flexible material is sufficiently flexible) such that the first and second light directing elements (each positioned to receive light from the LED assembly) are positioned back to back. In other words, the substrate is sufficiently bendable such that the first and the second LED assembly may face one another, such that they may be considered to be opposite one another.

According to a second aspect of the invention, there is provided a method of directing light emitted by a first output window of an LED assembly, the method comprising: receiving, at a first input window of a light directing element, light emitted from the first output window of an LED assembly; and directing light from the first input window to a second output window of the light directing element, wherein the second output window is in a plane substantially normal to a plane of the first output window and the second output window has a smaller area than the first output window.

In embodiments, the method further comprises upon receiving light of a first wavelength at the first input window, emitting further light having a different wavelength such that the light output at the second output window has a greater range of wavelengths than light received at the first input window.

According to a third aspect of the invention, there is provided a method of forming an LED module, the method comprising: providing an LED assembly comprising a plurality of LEDs, the LED assembly having a first output window from which light emitted by the said plurality of LEDs is output; providing a light directing element comprising a first input window and a second output window, wherein the light directing element is adapted to receive light at the first input window and direct the received light to be output at the second output window and wherein the second output window has a smaller area than the first output window; and positioning the light directing element input window to receive light output from the first output window at the first input window.

The light directing element may further be adapted to, upon receiving light of a first wavelength at the first input window, emit further light having a different wavelength such that the light output at the second output window has a greater range of wavelengths than light received at the first input window.

The method may further comprise encasing the LED assembly and the light directing element with an encasing mould so as to reduce light leakage, wherein the encasing mould is formed so as to not cover the second output window, thereby allowing light to be output from the LED module from the second output window.

The method optionally comprises: providing an additional LED assembly comprising a plurality of LEDs, the additional LED assembly having a third output window from which light emitted by the said plurality of LEDs is output; and providing an additional light directing element comprising a second input window and a fourth output window, wherein the light directing element is adapted to receive light at the second input window and direct the received light to be output at the fourth output window and wherein the fourth output window has a smaller area than the third output window, and positioning the additional light directing element input window to receive light output from the third output window at the second input window.

In further embodiments, the method comprises: mounting the light directing element to the LED assembly such that the first input window is directly coupled to the first output window; mounting the additional light directing element to the additional LED assembly such that the second input window is directly coupled to the third output window; mounting the LED assembly and the additional LED assembly on a single substrate, comprising a flexible portion wherein the flexible portion is adapted to be sufficiently bendable such that the light directing element and the additional light directing element are capable of being positioned back-to-back: and bending the flexible portion such that the light directing element and the additional light directing element are positioned back-to-back.

These and other aspects of the invention will be apparent from and elucidated with reference to the embodiment(s) described hereinafter.

BRIEF DESCRIPTION OF THE DRAWINGS

Examples of the invention will now be described in detail with reference to the accompanying drawings, in which:

FIG. 7 depicts a representative flow-chart of one method of directing light emitted from an LED assembly according to an embodiment of the invention; and FIG. 8 shows a representative flow-chart of one method of forming an LED module according to an embodiment of the invention.

DETAILED DESCRIPTION OF THE EMBODIMENTS

The invention provides an LED module having a concentrated light output window. Light output from a first output window of an LED assembly (e.g. from a plurality of LEDs) is passed to an input window of a light directing element and redirected to be emitted from a second, smaller output window of a light directing element. This difference in size thereby concentrates the light output by the light directing element. The second output window (of the light directing element) is substantially perpendicular to the first output window, allowing for the size of the LED assembly in a particular dimension to not be necessarily constrained by the size of the second output window.

Similar or the same features shall be identified using the same numerical references.

Figure 1:
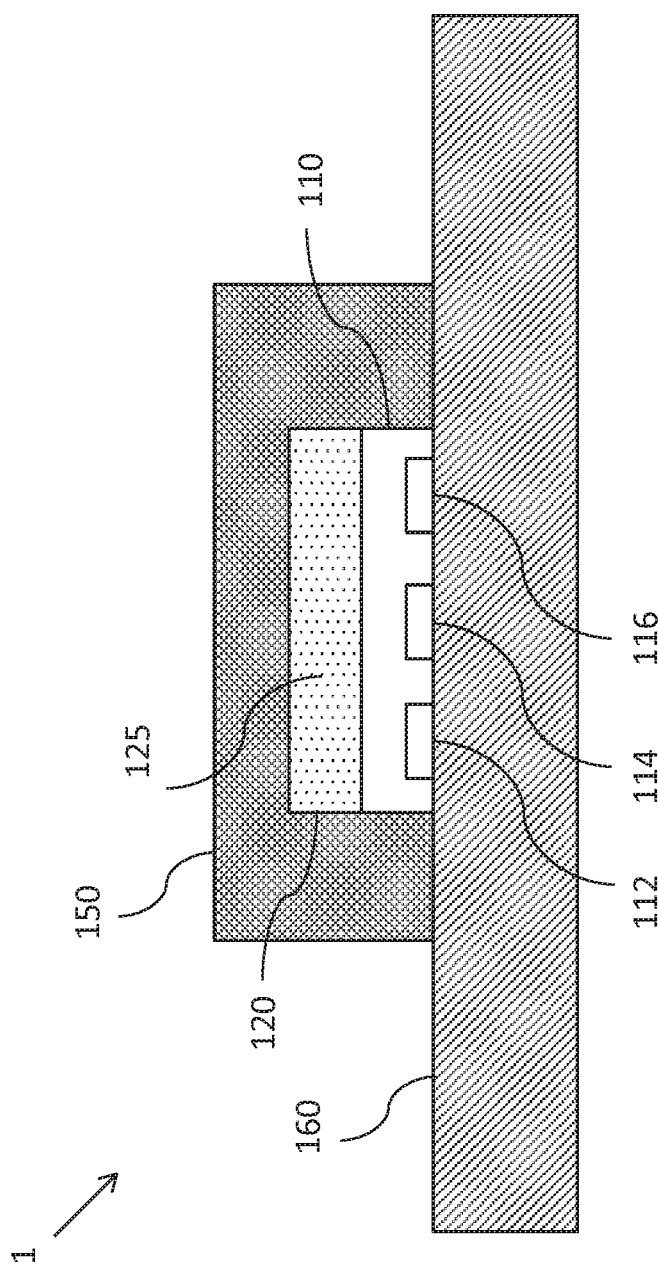
FIG. 1 illustrates a cross-section of an LED module according to a first embodiment of the invention.
Figure 2:
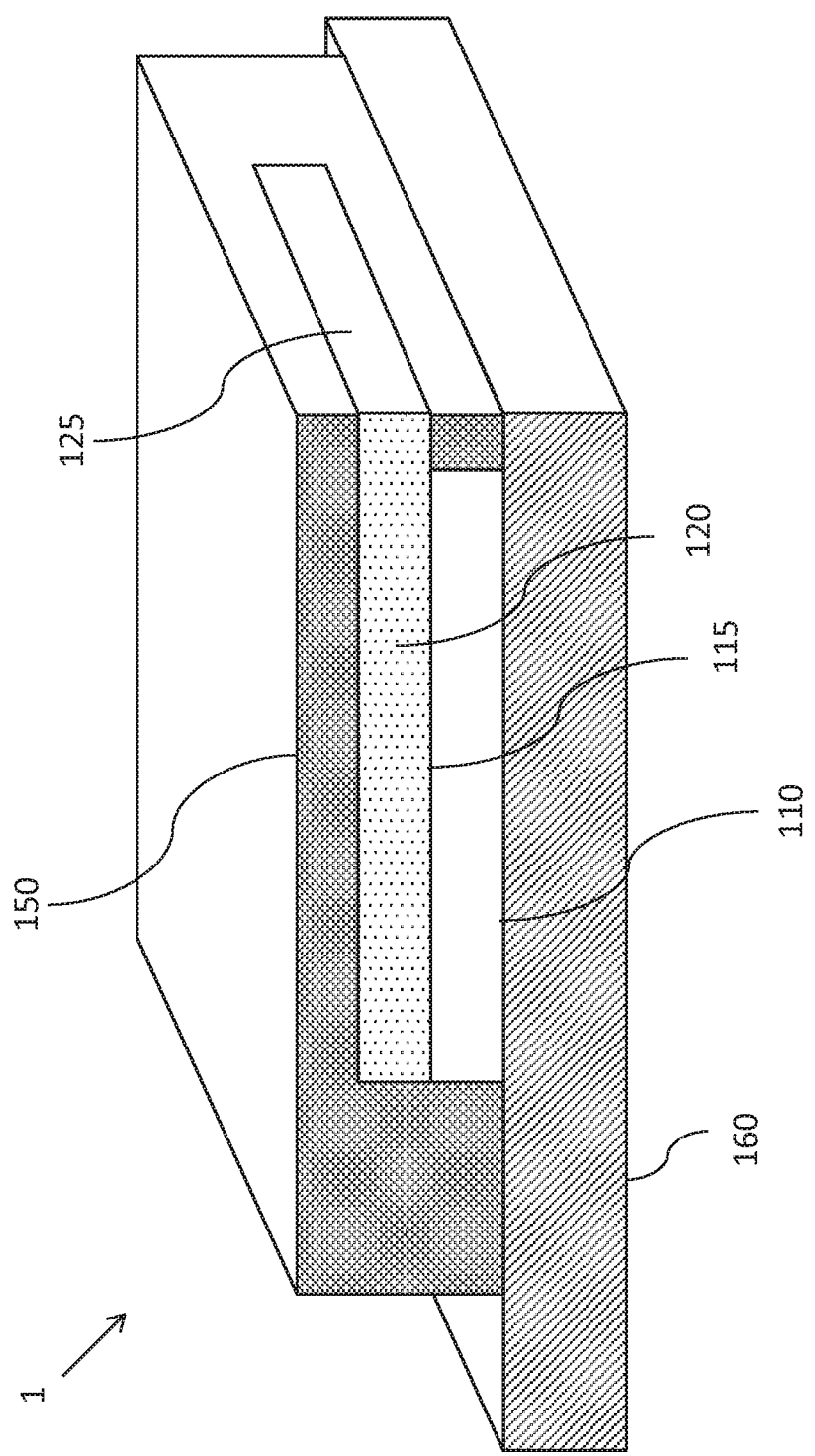
FIG. 2 shows a representative isometric view of the LED module according to the first embodiment of the invention.
Figure 3:
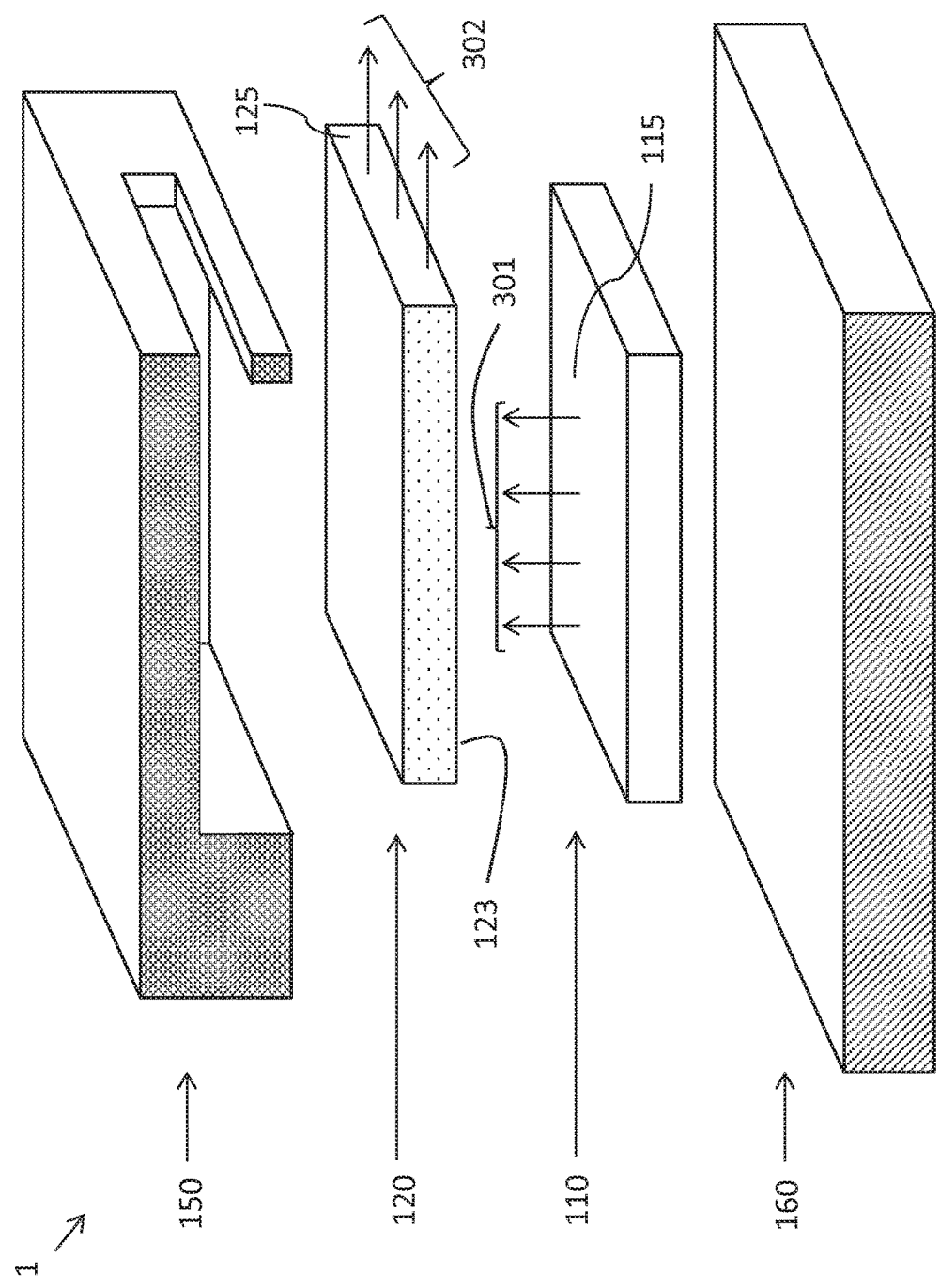
FIG. 3 illustrates an exploded isometric view of the LED module according to the first embodiment of the invention.

The basic structure of an LED module 1 according to a first embodiment of the invention may be understood with reference to FIGS. 1-3. FIG. 1 illustrates a cross section of the LED module 1 when viewed facing the second output window 125.

The LED module 1 comprises an LED assembly 110 mounted on a substrate 160. The LED assembly comprises a plurality of light emitting diodes, LEDs, (for example, first LED 112, second LED 114 and third LED 116) each adapted to emit light, thereby enabling the overall LED assembly to emit light. A light directing element 120 is positioned so as to receive light emitted by the LED assembly and is adapted to direct this light to be output at a face or end of the light directing assembly (i.e. a second output window 125). It will be apparent that the substrate 160 is an optional feature (i.e. the LED assembly and light directing element may be a freestanding chip).

The plurality of LEDs may be formed as a line of LEDs or otherwise as a dispersed array of LEDs.

In the present embodiment, the LED module comprises the optional feature of an encasing mould 150. The encasing mould 150 is adapted to sufficiently cover the LED assembly 110 and the light directing element 120 so as to reduce the amount of light escaping from the LED module. For example, the encasing mould 150 may be a reflective surface adapted to reflect any potential escaping light back into the LED assembly and/or the light directing element. The encasing mould is adapted to permit light to be output from the LED module at the second output window.

With specific reference to FIGS. 2 and 3, the operation of the LED module 1 may be more easily understood. FIG. 2 provides an isometric view of the LED module 1 that more clearly identifies the positioning of the light directing element 120 to the LED assembly 110. FIG. 3 is an exploded diagram of the isometric view of FIG. 2. FIGS. 2 and 3 are cross-sections through the device showing the device cut in half, in order to reveal the internal components.

Light emitted from the LED assembly may be thought to pass through a first output window 115 (e.g. on an upper surface of the LED assembly) in at least a first direction 301. The light directing element 120 is positioned to receive the light emitted through the first output window 115 at a first input window 123 (e.g. on the underside or on a lower surface of the light directing element 125). The light directing element is adapted to direct the light received through the first input window to be output from a second output window 125.

The first output window 115 may be formed as a face or surface of the LED assembly 110, or may simply represent a virtual plane through which light emitted by the LEDs passes.

The first input window 123 and the second output window 125 may be formed as a respective face or surface of the light directing element 120. Thus the light directing element may be formed from a single piece of material, having a plurality of surfaces or faces, wherein a first surface or face is positioned to receive light from the LED assembly and a second surface or face is positioned so as to output redirected light from the light directing element.

Preferably, the first input window 123 and the first output window 115 have the same area and are formed in the same shape.

In the present embodiment, to ensure light is emitted from the LED module only at the second output window 125, the (optional) encasing mould 150 is adapted to cover the other surfaces or faces of the light directing element 120 and the LED assembly 110 so as to prevent light escaping.

In other words, directing of light may be performed with the assistance of the encasing mould, which may, for example, be formed to as to only permit light to be emitted from the LED module at a particular surface (i.e. the second output window 125). Hence, the encasing mould may reflect light at surfaces of the light directing element 120 (when the surface is not the second output window surface) such that light is rebounded within the light directing element until reaching the second output window.

The encasing mould may be formed by, for example, a foil assisted moulding method. In other or further embodiments, the encasing mould may be formed as high-reflection coating over the LED assembly and/or the light directing element.

It will be understood that the encasing mould 150 is merely an optional feature, and the light directing element 120 may also/otherwise operate based on, for example, total internal reflection. For example, light may be internally reflected back into light directing element 120 due to a difference in refractive index between the material of the light directing element and an external (to the light directing element) material (for example, air). A particular surface of the light directing element may be adapted to not internally reflect the light (e.g. a surface may be corrugated and/or coated in an antireflective coating) so as to permit the light to escape from the light directing element. This particular surface may thereby act as the second output window The light directing element is formed and positioned such that the second output window 125 is in a plane substantially normal or perpendicular to the first output window 115. In other words, light being emitted in the first direction 301, where the first direction is normal to the first output window, is redirected so as to be emitted in a second direction 302 substantially perpendicular to the light in the first direction 301.

Positioning of the second output window in a plane substantially perpendicular to the first output window permits the area or size of the LED assembly in a particular direction (e.g. length, width and/or height) to not necessarily be restricted or otherwise limited by the area of the second output window (i.e. the output window of the LED module). This may allow for a greater area for heatsinking and/or additional LEDs to be provided to improve the efficiency/luminosity of the LED module.

For example, an LED module may be constrained in two-dimensions (e.g. the width and height of the LED module may be constrained by the available footprint for a desired size of the second output window), but may be of any depth/length. Positioning of the first output window (and hence, for example, the LED assembly) perpendicular to the second output window allows the LED assembly to extend in the depth direction, permitting a greater number of LEDs to be positioned on the LED assembly (therefore increasing the available light for output per LED module).

The second output window 125 is of a smaller area than the first output window 115. For example, the size of the area of the second output window 125 may be no more than half of the size of the area of the first output window, for example, no more than a quarter, for example, no more than a tenth. This difference in area may be thought to concentrate the light emitted by the LED assembly 110 into a smaller area, thereby increasing the effective light intensity/illuminance (lux or $lm/m^{-2}$) of light output by the LED module.

By way of example only, the second output window 125 may have an area of 0.1 $mm^2$ and the first output window 115 may have an area of 1.0 $mm^2$. Assuming an optical efficiency redirection of 100% (i.e. all light output by the LED assembly is redirected by the light directing element) a 10-fold increase in effective light intensity is realised.

Enabling the first output window 115 to have a greater area than the second output window 125 allows for additional LEDs to be positioned in the LED assembly, increasing the available light to be output by the LED module. Thus, for a given or desired LED module output window size (e.g. an output window is desired to have a size of 0.1 $mm^2$), a greater size of LED assembly may be provided (e.g., 10 $mm^2$, for example, 20 $mm^2$ or more), thereby allowing a greater number of LEDs to be positioned so as to provide more light to be output from the output window size than in previous products.

One exemplary light directing element may comprise light scattering particles or reflective particles (for example, liquid crystals or $TiO_2$) so as to scatter light received by the light directing element within the light directing element. This may allow, for example, the received light to be directed to all surfaces of the light directing element (including the second output window). In embodiments, light may only escape from the LED module via the second output window, for example, the other surfaces of the LED module are covered by the encasing mould/high-reflection coating or due to total internal reflection. In such embodiments, reflected light may be rescattered by the light scattering or reflective particles. Thus, light may, on the whole, be directed to the second output window In at least one embodiment, the light directing element 120 may additionally or otherwise comprise wavelength converting material (for example, phosphor particles or fluorescent material) to thereby act as a conversion element. In such exemplary embodiments, the light directing element may receive light having a first range of wavelengths at an input window, causing the wavelength converting material to be excited. This may result in the wavelength converting material emitting light having a second, different range of wavelengths. The light having the first range and the light having the second range may be mixed, such that light having a greater overall range of wavelengths is output from the second output window.

By way of example only, the first 112, second 114 and third 116 LEDs of the LED assembly may be high brightness blue LEDs (e.g. comprising GaN). In such embodiments, light received by the light directing element 120 may be blue. Phosphor particles in a light directing element may be excited, so as to cause the phosphor particles to emit yellow light. Thus the light directing element may output light at the second output window that comprises blue light and yellow light (e.g. comprises white light).

The wavelength converting materials may also act as light scattering particles (e.g. light emitted by the wavelength converting material may be in any direction).

Figure 4:
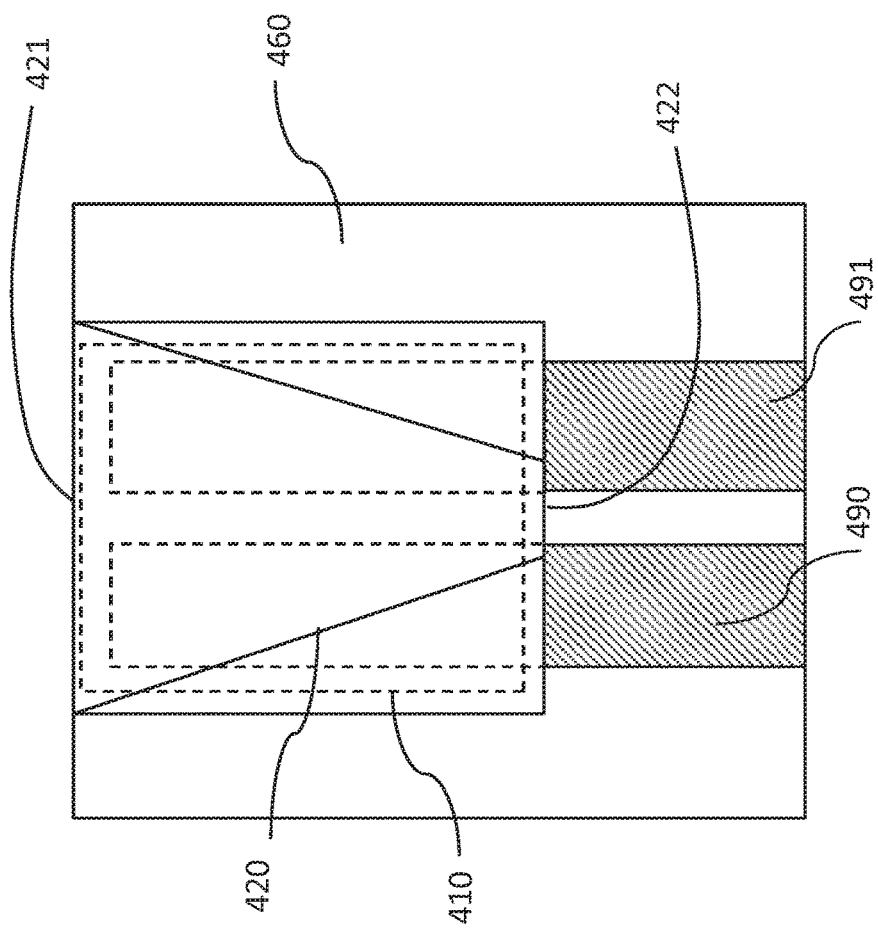
FIG. 4 depicts a schematic of a 'top-down' view of an LED module according to a second embodiment of the invention.

FIG. 4 is a top-down view LED module 4 according to a second embodiment of the invention. The structure of the LED module 4 is similar to the LED module described with reference to FIGS. 1-3, comprising a substrate 460, an LED assembly 410 and a light directing element 420 coupled together. For the sake of brevity, only those features which are embodied differently or not yet detailed shall be hereafter described. Thus, the LED assembly 410 and the light directing element 420 may be thought to generally operate in the same manner as previously described.

The light directing element 420 of the present embodiment is shaped a triangular prism. In other words, the light directing element 420 may be wedge-shaped. The second output window may be formed as the base of the wedge-shaped light directing element, such that a first end 421 of the light directing element 420 (i.e. the end where the second output window is formed) is wider than a second end 422 of the light directing element 420 opposite to and facing the first end 421.

In other words the light directing element 420 may be formed in the shape of a triangular prism, such that a first end 421 of the light directing element 420 is of a greater area than a second end 422 of the light directing element 420, and wherein the second output window is formed at the first end of the light directing element.

Such shaped light directing elements are herein recognised to optimize the directionality of the light inside the convertor element toward the second output window. This improves the optical collection and overall efficiency of the LED module 4, relative to an LED module not comprising a wedge-shaped light directing element.

There is also indicated in FIG. 4 a first connecting wire 490 and a second connecting wire 491 connected to the LED assembly 410. Such first 490 and second 491 connecting wires may provide, for example, power to the LED assembly or control the switching of the plurality of LEDs of the LED assembly. It will be apparent that any number of connecting wires may be provided to the LED assembly, and that such connecting wires may be formed, for example, as an aspect of the substrate 460.

It will be apparent that the LED module 4 may also be provided with an encasing mould (not shown) so as to reduce the amount of light that escapes the LED module (i.e. reduce the amount of light emitted from the LED module that is not emitted via the second output window).

Figure 5:
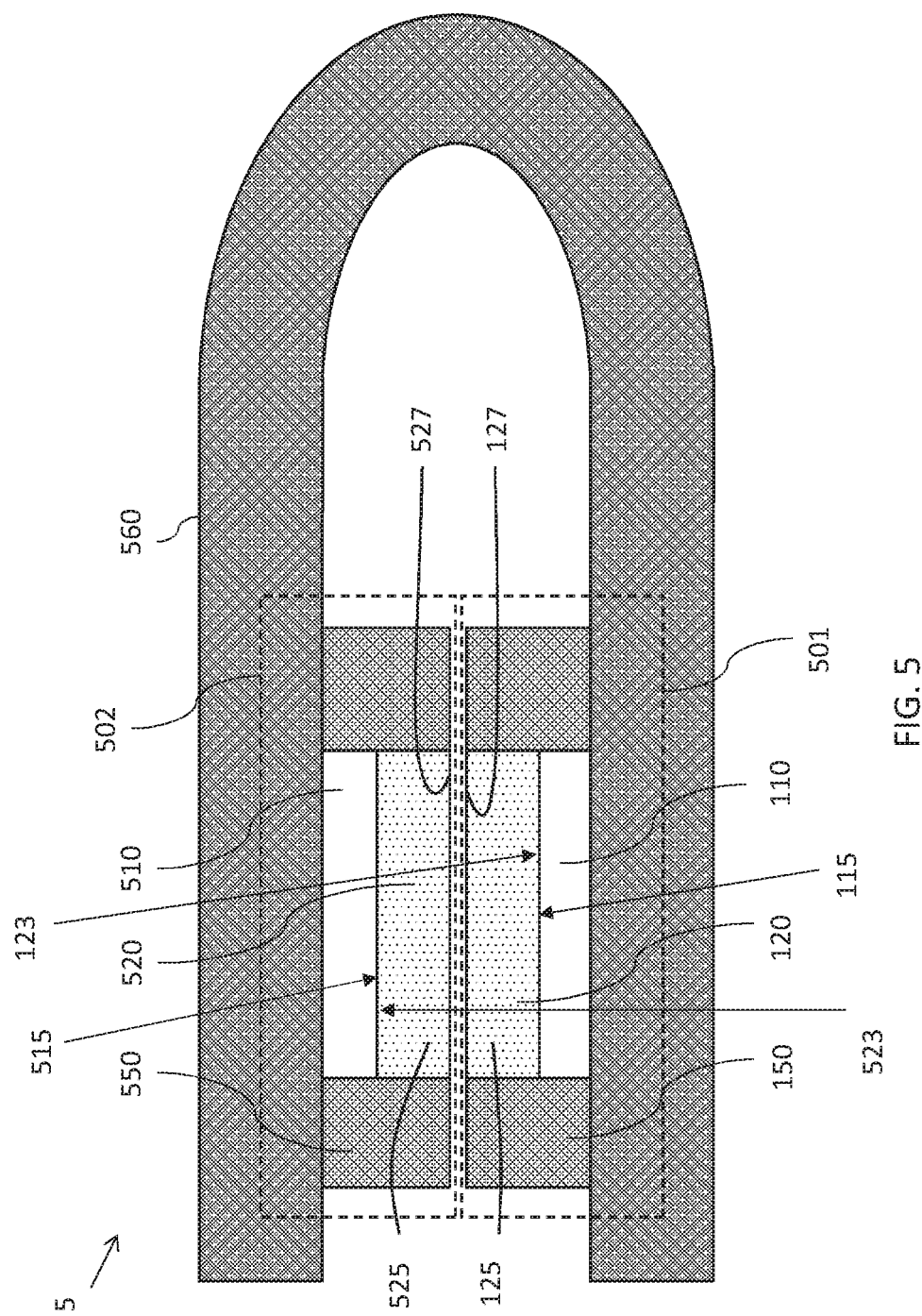
FIG. 5 illustrates a cross-section of an LED module according to a third embodiment of the invention.

With reference now to FIG. 5, an LED module 5 according to a third embodiment of the invention is described. The LED module 5 has first and second sub-modules 501, 502. The first sub-module 501 comprises a first light directing element 120, a first LED assembly 110 and a first encasing mould 150 formed as described with reference to the first embodiment of the invention. For the sake of conciseness, only those features which are embodied differently or not yet detailed shall be hereafter described.

The second sub-module 502 comprises a second light directing element 520 a second LED assembly 510 and a second encasing mould 550. It will be understood that the second light directing element may be embodied similar to the first lighting element such that light is received (from a third output window 515 of the second LED assembly) at a second input window 523 of the second light directing element. The light directing element directs this received light to a fourth output window 525 of the second light directing element.

The first 110 and second 510 LED assemblies are both mounted on the same single substrate 560, the single substrate comprising flexible material. Possible flexible materials may include polymers, for example polyimide, polyethylene and/or polyethylene naphthalate. The entirety of the substrate may, in embodiments, be flexible, such that the substrate consists of a single flexible portion.

Thus there may be considered to be a first sub-module 501 and a second sub-module 502, where each sub-module is mounted on the same substrate 560 and each sub-module comprises a respective LED assembly, a light directing element and an encasing mould.

The single substrate 560 of the present embodiment is substantially formed of a flexible material, such that the substrate 560 may be bent to allow the first and second light directing element to be positioned back-to-back. In other words, the first and second light directing elements may be positioned to run alongside proximate to one another (e.g. having a near-zero separation), such that the respective light output areas of the first and second light directing elements (i.e. second light output area 125 and fourth light output area 525) may be thought as a single cohesive area from which light is output from the LED module.

There may be considered a top surface of each light directing element (for example, a top surface 127 of the first light directing element 120 and a top surface 527 of the second light directing element), wherein the top surfaces are identified as those surfaces of the light directing elements that are positioned so as to run alongside one another.

In at least one embodiment, the encasing mould 150, 550 of each respective sub-module 501, 502 is adapted to not cover the top surface of each respective light directing element 120, 520. In other words, the encasing mould of each sub-module may be formed so as to not be disposed between the light directing elements 120, 520 of the first 501 and second 502 sub-module.

Positioning two respective light output areas together in this manner (so as to form a single, larger output area) advantageously allows an overall increase in light output from a specific or selected area, without reducing the heat dissipation made available to the respective LED assemblies (i.e. a heat path is still formed between each LED assembly and the single substrate). Furthermore, an increased heat dissipation area or overall LED assembly size is made available for a desired LED module output window size.

Figure 6:
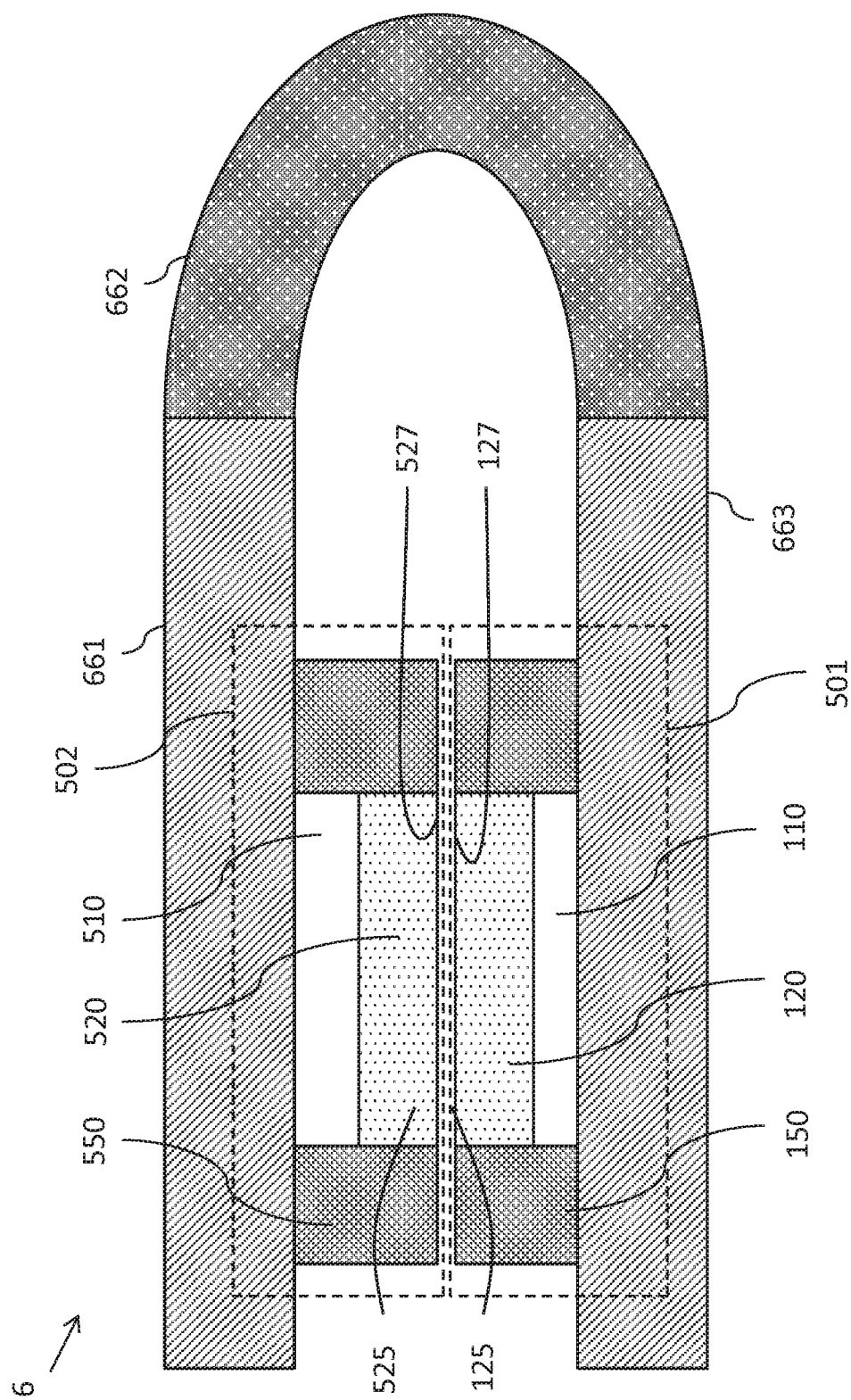
FIG. 6 illustrates a cross-section of an LED module according to a fourth embodiment of the invention.

FIG. 6 depicts a cross-section of an LED module 6 according to a fourth embodiment of the invention, wherein the LED module 6 comprising similar or the same features as that described with reference to the LED module 5 according to the third embodiment of the invention. For the purposes of conciseness, only those features which are embodied differently shall be hereafter described.

The single substrate upon which the first 501 and second 502 sub-modules are mounted is split or divided into a first substrate portion 661, a second substrate portion 662 and a third substrate portion 663. The first 661 and third 663 substrate portions (upon which a respective sub-module may be mounted) are not necessarily made of a flexible material, but may rather be made of more mechanically rigid material (e.g. AN, silicon, $Al_2O_3$, ceramic or metal core printed circuit boards). In the present embodiment, the second substrate portion 662 is made of a sufficiently flexible material such that the second substrate portion may bend so as to allow the first and second light directing elements to be positioned alongside and facing one another. In other words, the second substrate portion may be considered as a flexible portion of the substrate such that the substrate may be articulated.

It will be readily understood, therefore, that not all the single substrate upon which the first and second LED assemblies are mounted need be made of the flexible material, but that the substrate may instead comprise sufficient flexible material so as to allow the first and second light directing elements to be positioned back-to-back.

It will be readily understood by the skilled person that any number of LED sub-modules may be mounted on a single substrate without departing from the scope of the invention. For example, four sub-modules may be provided, wherein first and second sub-modules are positioned proximate to one another, and third and fourth sub-modules are positioned proximate to one another.

With reference now to FIG. 7 there is described a method of directing light emitted by a first output window of an LED assembly (comprising, for example, a plurality of LEDs), the method comprising: emitting 705 light (having a first range of wavelengths) from an output window of an LED assembly to be received by the first input window of the light directing element. The method then comprises receiving 710 the light at the first input window of a light directing element, and directing 720 light from the first input window to a second output window of the light directing element, wherein the second output window is in a plane substantially normal to a plane of the first output window and the second output window has a smaller area than the first output window.

Optionally, the method may further comprise emitting 730 further light having a different range of wavelengths to light received at the first input window of the light directing element, such that the light output at the second output window has a greater range of wavelengths than light received at the first input window.

With reference to FIG. 8, a method of forming an LED module may be readily understood.

The method comprises providing 810 an LED assembly comprising a plurality of LEDs, the LED assembly having a first output window from which light emitted by the said plurality of LEDs is output. The method also comprises providing 820 a light directing element comprising a first input window and a second output window, wherein the light directing element is adapted to receive light at the first input window and direct the received light to be output at the second output window and wherein the second output window has a smaller area than the first output window and positioning 830 the light directing element input window to receive light output from the first output window at the first input window.

Optionally, the method may further comprise encasing 840 the LED assembly and the light directing element with an encasing mould so as to reduce light leakage, wherein the encasing mould is formed so as to not cover the second output window, thereby allowing light to be output from the LED module from the second output window.

In at least one embodiment, the method further comprises providing 815 an additional LED assembly comprising a plurality of LEDs, the additional LED assembly having a third output window from which light emitted by the said plurality of LEDs is output; and providing 825 an additional light directing element comprising a second input window and a fourth output window, wherein the light directing element is adapted to receive light at the second input window and direct the received light to be output at the fourth output window and wherein the fourth output window has a smaller area than the third output window, and positioning 835 the additional light directing element input window to receive light output from the third output window at the second input window.

Similarly, in an optional embodiment, the method may further comprise encasing 845 the additional LED assembly and the additional light directing element with an encasing mould so as to reduce light leakage, wherein the encasing mould is formed so as to not cover the fourth output window, thereby allowing light to be output from the LED module from the fourth output window.

Optionally, the light directing element is directly coupled to the LED assembly and/or the additional light directing element is directly coupled to the additional LED assembly.

In at least one further embodiment, the method comprises mounting 850 the LED assembly and the additional LED assembly on a single substrate comprising a flexible portion, wherein the flexible portion is adapted to be sufficiently bendable such that the light directing element and the additional light directing element are capable of being positioned back-to-back and bending 860 the flexible portion such that the light directing element and the additional light directing element are positioned back-to-back.

Phosphor materials suitable for providing the light conversion are widely available.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A light emitting diode module comprising:
   a light emitting diode assembly comprising a plurality of light emitting diodes, the light emitting diode assembly having a first output window from which light emitted by the said plurality of light emitting diode is output;
   a light directing element comprising a first input window and a second output window, wherein the light directing element is adapted to receive light at the first input window and direct the received light to be output at the second output window,
   wherein:
   the light directing element is positioned to receive light output from the first output window at the first input window;
   the second output window has a smaller area than the first output window; and
   the second output window is in a plane substantially normal to a plane of the first output window;
   an additional light emitting diode assembly comprising a plurality of additional light emitting diodes, the additional light emitting diode assembly having a third output window from which light emitted by the said plurality of additional light emitting diodes is output; and
   an additional light directing element comprising a second input window and a fourth output window, wherein the light directing element is adapted to receive light at the second input window and direct the received light to be output at the fourth output window,
   wherein
   the additional light directing element is positioned to receive light output from the third output window at the second input window;
   the fourth output window has a smaller area than the third output window; and
   the fourth output window is in a plane substantially normal to a plane of the third output window;
   wherein
   the light directing element and the additional light directing element are being positioned back-to-back; and
   the light emitting diode assembly and the additional light emitting diode assembly are both mounted on a single substrate comprising a flexible portion.

2. The light emitting diode module of claim 1 wherein the light directing element is directly coupled to the light emitting diode assembly such that light output from the first output window of the light emitting diode assembly is directly coupled into the first input window of the light directing element and/or wherein the additional light directing element is directly coupled to the additional light emitting diode assembly such that light output from the third output window of the additional light emitting diode assembly is directly coupled to the second input window of the additional light directing element.

3. The light emitting diode module of claim 1, wherein the light emitting diode assembly and the additional light emitting diode assembly are mounted on a flexible substrate.

4. The light emitting diode module of claim 1, wherein the light directing element respectively the additional light directing element is further adapted to, upon receiving light of a first wavelength at the first input window respectively the second input window, emit further light having a different wavelength such that the light output at the second output window respectively the fourth output window has a greater range of wavelengths than light received at the first input window respectively the second input window.

5. The light emitting diode module of claim 1, further comprising:
   an encasing mould adapted to encase the light emitting diode assembly and the light directing element respectively the additional light emitting diode assembly and the additional light directing element so as to reduce light leakage from the said light emitting diode assembly and light directing element respectively from the said additional light emitting diode assembly and additional light directing element,
   wherein the encasing mould is formed so as to not cover the second respectively the fourth output window, thereby allowing light to be output from the light emitting diode module from the second respectively the fourth output window.

6. A method of forming a light emitting diode module, the method comprising:
   providing a light emitting diode assembly comprising a plurality of light emitting diodes, the light emitting diode assembly having a first output window from which light emitted by the said plurality of light emitting diode is output;
   providing a light directing element comprising a first input window and a second output window, wherein the light directing element is adapted to receive light at the first input window and direct the received light to be output at the second output window and wherein the second output window has a smaller area than the first output window; positioning the light directing element to receive light output from the first output window at the first input window;
   providing an additional light emitting diode assembly comprising a plurality of additional light emitting diode, the additional light emitting diode assembly having a third output window from which light emitted by the said plurality of light emitting diode is output;
   providing an additional light directing element comprising a second input window and a fourth output window, wherein the light directing element is adapted to receive light at the second input window and direct the received light to be output at the fourth output window and wherein the fourth output window has a smaller area than the third output window;
   positioning the additional light directing element to receive light output from the third output window at the second input window;
   mounting the light emitting diode assembly and the additional light emitting diode assembly on a single substrate comprising a flexible portion, wherein the flexible portion is adapted to be sufficiently bendable such that the light directing element and the additional light directing element are capable of being positioned back-to-back: and
   bending the flexible portion such that the light directing element and the additional light directing element are positioned back-to-back.

7. The method of claim 6, wherein the light directing element respectively the additional light emitting element are further adapted to, upon receiving light of a first wavelength at the first input window respectively the second input window, emit further light having a different wavelength such that the light output at the second output window respectively at the fourth output window has a greater range of wavelengths than light received at the first input window respectively the second input window.

8. The method of claim 6 comprising:
   encasing the light emitting diode assembly and the light directing element receptively the additional light emitting diode assembly and the additional light directing element with an encasing mould so as to reduce light leakage, wherein the encasing mould is formed so as to not cover the second respectively fourth output window, thereby allowing light to be output from the light emitting diode module from the second respectively fourth output window.

9. The method of claim 6 comprising:
   mounting the light directing element to the light emitting diode assembly such that the first input window is directly coupled to the first output window;
   mounting the additional light directing element to the additional light emitting diode assembly such that the second input window is directly coupled to the third output window.

* * * * *